(12) United States Patent
Bergemont et al.

(10) Patent No.: US 6,208,557 B1
(45) Date of Patent: Mar. 27, 2001

(54) EPROM AND FLASH MEMORY CELLS WITH SOURCE-SIDE INJECTION AND A GATE DIELECTRIC THAT TRAPS HOT ELECTRONS DURING PROGRAMMING

(75) Inventors: Albert Bergemont, Palo Alto; Alexander Kalnitsky, San Francisco, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/316,445

(22) Filed: May 21, 1999

(51) Int. Cl.$^7$ .............................. G11C 16/04; H01L 29/76
(52) U.S. Cl. ................. 365/185.15; 365/185.14; 257/319; 257/320
(58) Field of Search .................. 365/185.07, 185.14, 365/185.15; 257/315, 316, 319, 320

(56) References Cited

U.S. PATENT DOCUMENTS

| | | | |
|---|---|---|---|
| 5,168,465 | * 12/1992 | Harari | 365/185.15 |
| 5,284,784 | * 2/1994 | Manley | 365/185.15 |
| 5,338,952 | * 8/1994 | Yamauchi | 365/185.15 |
| 5,394,360 | * 2/1995 | Fukumoto | 365/185.15 |
| 5,402,371 | * 3/1995 | Ono | 365/185.07 |
| 5,422,504 | * 6/1995 | Chang et al. | 365/185.15 |
| 5,455,792 | * 10/1995 | Yi | 365/185.15 |
| 5,768,192 | 6/1998 | Eitan | 365/185.24 |
| 6,011,725 | 1/2000 | Eitan | 365/185.33 |

OTHER PUBLICATIONS

Silicon Processing For The VLSI Era, vol. 2, Process Integration, Stanley Wolf Ph.D., Lattice Press, Sunset Beach, California, pp. 628–629.

* cited by examiner

*Primary Examiner*—Son Mai
(74) *Attorney, Agent, or Firm*—Limbach & Limbach L.L.P.

(57) ABSTRACT

An electrically-programmable read-only-memory (EPROM) and a flash memory cell having source-side injection are formed with a gate dielectric material, and a pair of gates that are both formed on the gate dielectric material. The gate dielectric material has substantially more electron traps than hole traps so that the gate dielectric material is capable of having a negative potential which is sufficient to inhibit the formation of a conductive channel during a read operation.

6 Claims, 2 Drawing Sheets

EPROM AND FLASH MEMORY CELLS WITH SOURCE-SIDE INJECTION AND A GATE DIELECTRIC THAT TRAPS HOT ELECTRONS DURING PROGRAMMING

BACKGROUND OF THE INVENTION

1. Field of the Invention

The present invention relates to EPROM and flash memory cells and, more particularly, EPROM and flash memory cells with source-side injection and a gate dielectric that traps hot electrons during programming.

2. Description of the Related Art

An electrically-programmable read-only-memory (EPROM) cell and a flash memory cell are non-volatile memories that retain data stored in the cell after power to the cell has been removed. EPROM and flash memory cells principally differ from each other in that EPROM cells are erased with ultraviolet (UV) light, while flash cells are electrically erased.

FIG. 1 shows a cross-sectional view that illustrates a prior-art EPROM or flash memory cell 100. As shown in FIG. 1, cell 100 includes spaced-apart n+ source and drain regions 112 and 114 which are formed in a p-type substrate 110, and a channel region 116 which is defined in substrate 110 between source and drain regions 112 and 114.

In addition, cell 100 also includes a layer of gate oxide 120 which is formed over channel region 116, and a floating gate 122 which is formed over gate oxide layer 120. Further, cell 100 additionally includes a layer of interpoly dielectric 124 which is formed over floating gate 122, and a control gate 126 which is formed over dielectric layer 124.

Cell 100 is programmed by applying a programming voltage to control gate 126, a drain voltage to drain region 114, and ground to source region 112. The programming voltage applied to control gate 126 induces a positive potential on floating gate 122 which, in turn, attracts electrons to the surface of channel region 116 to form a channel 130.

In addition, the drain-to-source voltage sets up an electric field which causes electrons to flow from source region 112 to drain region 114 via channel 130. As the electrons flow to drain region 114, the electric field, which has a maximum near drain region 114, accelerates these electrons into having ionizing collisions that form channel hot electrons near drain region 114.

A small percentage of the channel hot electrons are then injected onto floating gate 122 via gate oxide layer 120. Cell 100 is programmed when the number of electrons injected onto floating gate 122 is sufficient to prevent channel 130 from being formed when a read voltage is subsequently applied to control gate 126.

Since electrons are injected onto floating gate 122 near drain region 114, cell 100 is referred to as having drain-side injection. However, by altering the structure of the cell, electron injection can alternately take place near the source region.

When electrons are injected onto a floating gate near the source region, the cell is referred to as having source-side injection. U.S. Pat. No. 5,212,541 to Bergemont discloses a prior-art EPROM cell with source-side injection.

FIG. 2 shows a cross-sectional view that illustrates a source-side injection EPROM cell 200 as disclosed by the '541 patent. FIG. 2 is similar to FIG. 1 and, as a result, utilizes the same reference numerals to designate the structures which are common to both cells.

As shown in FIG. 2, cell 200 differs from cell 100 in that source region 112 no longer lies directly below floating gate 122 and control gate 126, but instead is spaced apart from the region that lies directly below floating and control gates 122 and 126.

Further, cell 200 includes a polysilicon (poly) spacer 210 that is formed over source region 112 and a portion of channel region 116, and is isolated from source region 112, the portion of channel region 116, floating gate 122, and control gate 126.

In operation, cell 200 is programmed in the same manner that cell 100 is programmed except that cell 200 also applies a low positive voltage to poly spacer 210. Under these biasing conditions, the structure of cell 200 alters the drain-to-source electric field so that the electric field has a peak in the channel region that lies below the isolation region that separates poly spacer 210 from floating and control gates 122 and 126.

As a result, channel hot electrons are formed in this channel region where a number of these hot electrons are injected onto floating gate 122. As with cell 100, cell 200 is programmed when the number of electrons injected onto floating gate 122 is sufficient to prevent channel 130 from being formed when a read voltage is subsequently applied to control gate 126.

SUMMARY OF THE INVENTION

The present invention provides an electrically-programmable read-only-memory (EPROM) or a flash memory cell with source-side injection and a gate dielectric that traps hot electrons during programming.

The memory cell of the present invention, which is formed in a semiconductor material of a first conductivity type, includes spaced-apart source and drain regions of a second conductivity type which are formed in the material, and a channel region which is defined in the material between the source and drain regions. The channel region, in turn, has a first region, a second region, and a third region.

The cell also includes an isolation layer which is formed on the semiconductor material over the channel region. The isolation layer, in turn, includes a material, such as nitride, that has substantially more electron traps than hole traps so that the isolation layer is capable of having a negative potential which is sufficient to inhibit the formation of a conductive channel during a read operation.

The cell of the present invention also includes a first gate which is formed on the isolation layer over the first channel region, an isolation region which is formed on the isolation layer over the second channel region, and a second gate which is formed on the isolation layer over the third channel region.

The cell of the present invention is programmed by applying a programming voltage to the first gate, an intermediate voltage to the drain region, and a low positive voltage to the second gate. In addition, ground is applied to the source region and the semiconductor material.

The cell of the present invention is erased by applying a first erase voltage to the first gate, a second erase voltage to the drain region, and the first erase voltage to the second gate. In addition, ground is applied to the source region and the semiconductor material.

The cell of the present invention is read by applying a first read voltage to the first and second gates, and a second read voltage to the drain region. In addition, ground is applied to the source region and the semiconductor material.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
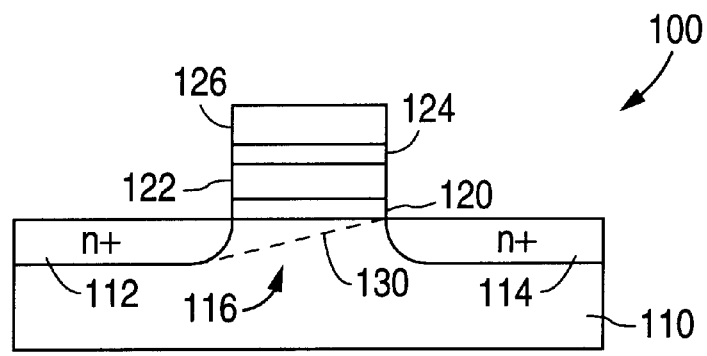
FIG. 1 is a cross-sectional view illustrating a prior art EPROM or flash memory cell 100.
Figure 2:
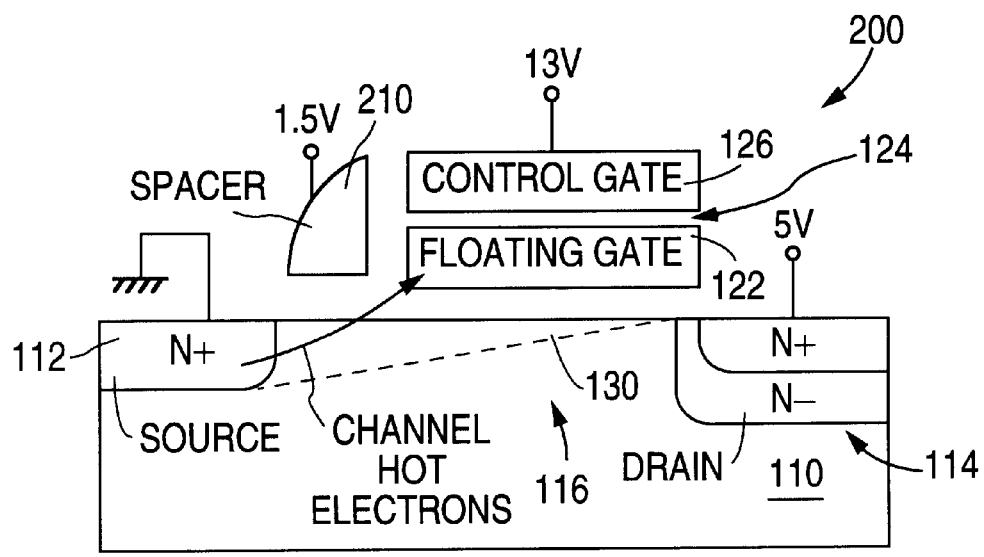
FIG. 2 is a cross-sectional view illustrating a source-side injection EPROM cell 200 as disclosed by U.S. Pat. No. 5,212,541 to Bergemont.
Figure 3:
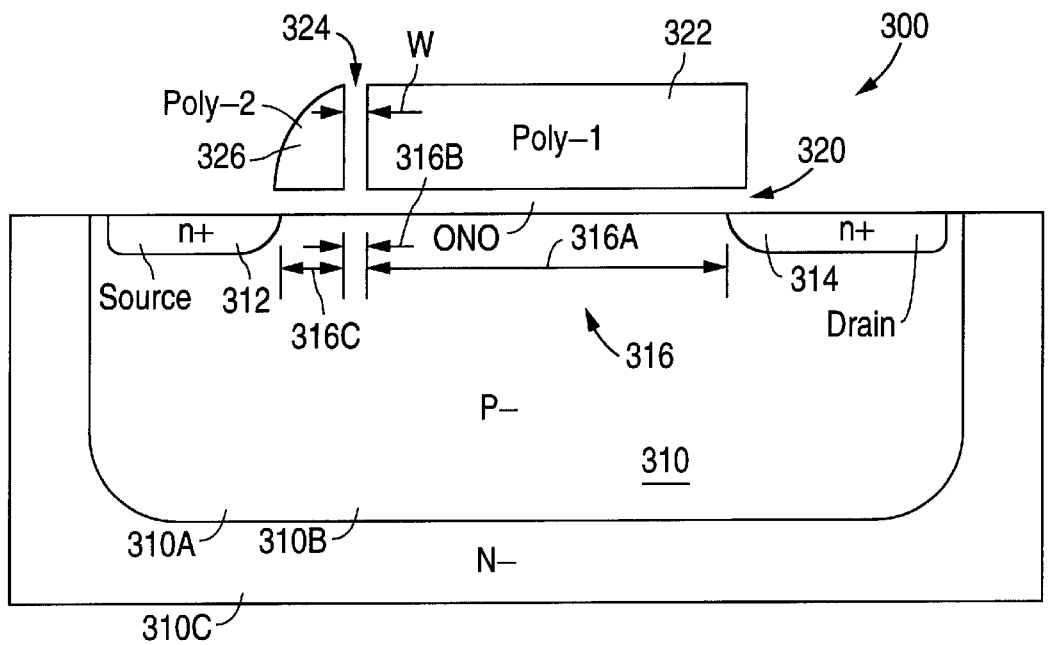
FIG. 3 is a cross-sectional view illustrating an EPROM or flash EPROM cell 300 in accordance with the present invention.

FIG. 3 shows a cross-sectional view that illustrates an EPROM or flash EPROM cell 300 in accordance with the present invention. As shown in FIG. 3, cell 300 is formed in a p-type semiconductor material 310, such as a p– substrate 310A or a p-well 310B formed in a n– substrate 310C, and includes n+ spaced-apart source and drain regions 312 and 314, respectively, which are formed in material 310.

Cell 300 also includes a channel region 316 which is defined in material 310 between source and drain regions 312 and 314, and a layer of gate isolation material 320 which is formed on material 310 over channel region 316. Channel region 316, in turn, has a first channel region 316A, a second channel region 316B, and a third channel region 316C.

In accordance with the present invention, gate isolation layer 320 is implemented with a first layer of oxide, a layer of nitride which is formed over the first oxide layer, and a second layer of oxide which is formed over the layer of nitride. This three layer structure, which is known as ONO, is typically used as an interpoly dielectric in non-volatile floating-gate memory cells.

In a 0.35 micron photolithographic process, the first oxide layer is formed to be approximately 20–100 Å thick, the nitride layer is formed to be approximately 50–200 Å thick, and the second oxide layer is formed to be approximately 30–100 Å thick. Similarly, in a 0.25 micron photolithographic process, the first oxide layer is formed to be approximately 20–100 Å thick, the nitride layer is formed to be approximately 40–200 Å thick, and the second oxide layer is formed to be approximately 30–100 Å thick.

In addition, cell 300 further includes a first polysilicon (poly) gate 322 which is formed on gate isolation layer 320 over channel region 316A, and an isolation region 324, such as an oxide, which is formed on gate isolation layer 320 adjacent to gate 322 over channel region 316B.

Further, cell 300 additionally includes a second poly gate 326 which is also formed on gate isolation layer 320 adjacent to isolation region 324 over channel region 316C. (Second gate 326 is shown as a poly spacer in FIG. 3, but may also have other, such as rectangular, shapes.)

In operation, cell 300 is programmed by applying a programming voltage to gate 322; an intermediate voltage to drain region 314, and ground to source region 312. In addition, a low positive voltage is applied to second gate 326.

For example, in a 0.35 micron photolithographic process, 3–10V can be applied to gate 322, 3–7V can be applied to drain region 314, and 1.5–2.0V can be applied to second gate 326. Similarly, in a 0.25 micron photolithographic process, 2–10V can be applied to gate 322, 2–7V can be applied to drain region 314, and 1–2V can be applied to second gate 326.

When material 310 is a p-substrate (source and drain regions 312 and 314 are n+), ground is applied to the substrate. When material 310 is a p-well in a n-type substrate, ground is applied to the p-well while a positive voltage, such as the programming voltage, is applied to the substrate. This reverse-biases the well-to-substrate junction which, in turn, isolates cell 300 to avoid program/erase disturb when the cell is formed in an array.

The programming voltage applied to gate 322 attracts electrons to the surface of channel region 316 to form a channel. In addition, the source-to-drain voltage sets up an electric field which has a maximum in second channel region 316B.

The width W of isolation region 324 (and the corresponding second channel region 316B) determines the strength of the electric field in second channel region 316B. As the width W is reduced from the width that corresponds with the maximum electric field, the amount of source-side injection falls and eventually stops, while the amount of drain-side injection increases. On the other hand, as the width W is increased from the width that corresponds with the maximum electric field, the magnitude of the read current falls and eventually stops.

The electric field causes electrons to flow from source region 312 to drain region 314 via the channel. As the electrons flow to drain region 314, the electric field accelerates these electrons into having ionizing collisions that form channel hot electrons near the junction of channel regions 316A and 316B.

A small percentage of the channel hot electrons are then injected into the nitride layer of ONO layer 320 where the electrons are trapped. Nitride has significantly more electron traps than hole traps and is thus capable of having a net negative charge.

Cell 300 is programmed when the number of electrons trapped in the nitride layer of ONO layer 320 produce a net negative charge which is sufficient to prevent a conductive channel from being formed when a read voltage is subsequently applied to gate 322.

Cell 300 is read by applying the intermediate voltage to gate 322 and second gate 326, and a read voltage to drain region 314. Ground is applied to source region 312. When material 310 is a substrate, ground is applied to the substrate. When material 310 is a well, ground is applied to the well while the intermediate voltage is applied to the substrate.

When formed as a flash memory cell, cell 300 is erased by applying ground to gate 322 and second gate 326, and the programming voltage to source and drain regions 312 and 314. (Alternately, a negative voltage can be applied to gate 322 and second gate 326 so that a positive voltage which is lower than the programming voltage can be applied to source and drain regions 312 and 314.) In addition, the voltage applied to source and drain regions 312 and 314 is also applied to the p-substrate, or the p-well and n-substrate.

Figure 4:
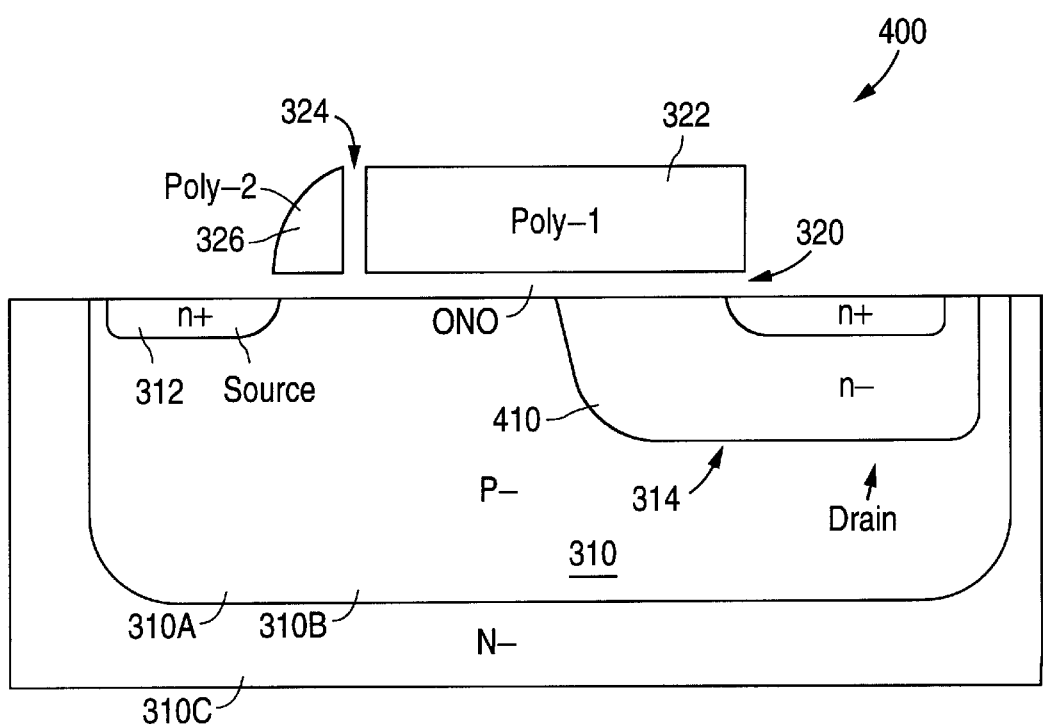
FIG. 4 is a cross-sectional diagram illustrating an EPROM or flash EPROM cell 400 in accordance with a first alternate embodiment of the present invention.

FIG. 4 shows a cross-sectional diagram that illustrates an EPROM or flash EPROM cell 400 in accordance with a first alternate embodiment. Cell 400 is similar to cell 300 and, as a result, utilizes the same reference numerals to designate the structures which are common to both cells.

As shown in FIG. 4, cell 400 differs from cell 300 in that cell 400 includes a lightly-doped drain (LDD) region 410 that is formed in material 310 while drain region 314 is formed in LDD region 410. LDD region 410, which reduces the strength of the electric field at the drain-to-material (310) junction, reduces the erase and read times.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A memory cell formed in a semiconductor material of a first conductivity type, the memory cell comprising:

a source region of a second conductivity type formed in the semiconductor material;

a drain region of the second conductivity type formed in the semiconductor material;

a channel region defined in the material between the source and drain regions, the channel region having a first region, a second region, and a third region;

a first isolation layer formed on the semiconductor material over the channel region;

a non-conductive layer formed on the first isolation layer, the non-conductive layer having a material not found in the first isolation layer, the non-conductive layer trapping a first number of electrons when the memory cell is programmed, and a second number of electrons when the memory cell is unprogrammed, the first number being different from the second number;

a second isolation layer formed on the nonconductive layer;

a first gate formed on the second isolation layer over the first channel region;

an isolation region formed on the second isolation layer over the second channel region; and a second gate formed on the second isolation layer over the third channel region.

2. The cell of claim 1 wherein a width of the isolation region is sized to allow source-side injection.

3. The cell of claim 1 wherein a width of the isolation region is sized such that a drain-to-source electric field has a maximum strength near a junction of the first and second channel regions.

4. The cell of claim 1 and further comprising a low-density drain region formed in the semiconductor material, wherein the drain region is formed in the low-density drain region.

5. The cell of claim 1 wherein the nonconductive layer has a material not found in the second isolation layer.

6. The cell of claim 1 wherein the first isolation layer is oxide, the non-conductive layer is nitride, and the second isolation layer is oxide.

* * * * *